United States Patent [19]

Kaplan et al.

[11] Patent Number: 5,131,582

[45] Date of Patent: * Jul. 21, 1992

[54] ADHESIVE METALLIC ALLOYS AND METHODS OF THEIR USE

[75] Inventors: Alvaro Kaplan, Brookline; George O. Zimmerman, South Hamilton, both of Mass.

[73] Assignee: Trustees of Boston University, Boston, Mass.

[*] Notice: The portion of the term of this patent subsequent to Oct. 30, 2007 has been disclaimed.

[21] Appl. No.: 629,915

[22] Filed: Dec. 19, 1990

Related U.S. Application Data

[63] Continuation-in-part of Ser. No. 561,386, Aug. 1, 1990, which is a continuation of Ser. No. 374,411, Jun. 30, 1989, Pat. No. 4,966,142.

[51] Int. Cl.$^5$ ............................ B23K 1/00; B23K 35/26
[52] U.S. Cl. .................................... 228/121; 228/122
[58] Field of Search ........... 228/121, 122, 123, 263.12; 420/555, 580, 526

[56] References Cited

U.S. PATENT DOCUMENTS

| | | | |
|---|---|---|---|
| 1,959,668 | 5/1934 | Gray | 420/526 |
| 2,717,840 | 9/1955 | Bosch | 420/555 X |
| 3,165,403 | 1/1965 | Treaftis et al. | 420/526 |
| 3,169,859 | 2/1965 | Treaftis et al. | 420/555 |
| 3,249,408 | 5/1966 | Marafioti | 420/555 X |
| 3,323,912 | 6/1967 | Bolda | 420/555 |
| 3,374,093 | 3/1968 | King | 420/580 |
| 4,966,142 | 10/1990 | Zimmerman | 228/179 X |

FOREIGN PATENT DOCUMENTS 830412 3/1960 United Kingdom ............ 420/555

*Primary Examiner*—Kenneth J. Ramsey
*Attorney, Agent, or Firm*—David Prashker

[57] ABSTRACT

A unique class of adhesive alloys and bonding methods for their use are provided which enable the user to join non-conductive materials to themselves or to electrically conductive materials. The bonding alloys have enhanced wetting properties and a melting point less than 100° C. in all instances. The bonding alloys are unusual and advantageous in that they create an intimate, direct, and enduring contact between the materials while minimizing mechanical and chemical stresses.

4 Claims, No Drawings

ADHESIVE METALLIC ALLOYS AND METHODS OF THEIR USE

CROSS-REFERENCE

The present application is a Continuation-In-Part of U.S. patent application Ser. No. 561,386 filed Aug. 1, 1990, now pending, which is a Continuation of U.S. patent application Ser. No. 374,411 filed Jun. 30, 1989, now U.S. Pat. No. 4,966,142, issued Oct. 30, 1990.

FIELD OF THE INVENTION

The present invention is concerned with metallic alloys useful as general adhesives with non-conductive materials; and is directed to low temperature melting alloys with enhanced wetting properties which adhere to many synthetic materials which are difficult to join together.

BACKGROUND OF THE INVENTION

Traditionally, solders - a general term for alloys useful for joining metals together by the process of soldering—have been used to electrically join conductors to themselves and to semi-conductors. The principal types of solder conventionally known are soft solders such as lead-tin alloys; and brazing solders such as alloys of copper and zinc and sometimes silver. Representative of conventionally known solders and soldering techniques are U.S. Pat. No. 3,600,144 describing a low melting point brazing alloy; U.S. Pat. No. 4,050,956 describing a method of chemically bonding metals to refractory oxide ceramics; U.S. Pat. No. 4,580,714 disclosing a hard solder alloy comprising copper, titanium, aluminum, and vanadium; U.S. Pat. No. 4,582,240 revealing a method for intermetallic diffusion bonding of piezo-electric components; U.S. Pat. No. 4,621,761 identifying a brazing process for forming strong joints between metals and ceramics while limiting the brazing temperature to not more than 750° C.; and U.S. Pat. No. 4,631,099 describing a method for adhesion of oxide type ceramics and copper or a copper alloy. More recent attempts to refine techniques for lowering the resistance of electrical contacts between superconductive materials include annealing bulk scintered samples of yttrium-barium-copper oxide at temperatures up to 500° C. for an hour [*Superconductor News*, May-June, 1988, page 5]; and the use of laser energy to deposit a thin film of superconductive yttrium-barium-copper oxide directly onto a silicon substrate [*Superconductor News*, May-June, 1988, page 1]. All of these methods require either extreme temperatures or sophisticated equipment.

In comparison, adhesives and general bonding compositions especially for joining matter which is not electrically conductive in any meaningful degree generally do not employ metallic alloys at all. Rather, most conventional adhesives are not metallic alloy compositions at all; instead, adhesives typically are formulated as alkali-metal silicates, acrylate and cyanoacrylate esters, epoxides and epoxys of varying formulation, and the traditional gum-based adhesives such as rubber cement. Clearly, the technology and research interest of adhesives of varying formulation and composition is intense; and the chemical industry is heavily invested both economically and technically in producing many different adhesives and bonding agents suitable for a variety of different purposes and applications.

Noteworthy, however, is the recurring difficulty of bonding non-conductive, synthetic materials such as the various plastics, fluorochlorocarbon compositions such as Teflon, and materials such as glass. Although specialty formulations for bonding these various synthetic materials are available, these remain difficult substances to bond to themselves or to other materials, be they electrically conducting or not. Accordingly, it will be recognized and appreciated by ordinary practitioners that were a metallic alloy formulation to become available which could effectively join and bond non-conductive materials to themselves or to electrically conductive matter, such an improvement would be recognized as providing a major advance and benefit in the pertinent art.

SUMMARY OF THE INVENTION

The present invention provides a method for bonding nonconductive materials to themselves or to conductive materials, said method comprising the steps of:
  obtaining a bonding alloy comprising
    from about 10 to 40 atomic percent mercury, and an additive comprised of from about 0 to about 90 atomic percent indium, and from 0 to about 90 atomic percent gallium;
  preparing a surface of each material to be joined as a clean surface;
  heating said alloy such that at least a semi-liquid state is formed;
  introducing said heated alloy to each non-oxidized surface such that each of said surfaces becomes substantially wetted by said heated alloy;
  applying additional heated alloy to each of said wetted surfaces concurrently to form a continuous alloy juncture between said materials: and
  allowing said alloy juncture to cool and solidify such that a bonded interface between said surfaces is provided by said solidified alloy.

DESCRIPTION OF THE PREFERRED EMBODIMENTS

The present invention is a metallic alloy, conventionally termed a solder, which when melted into a liquid or semi-liquid state is useful for joining and providing adhesive contact between non-conductive materials, between electrical conductors, and between electrical conductors and non-conductive materials. Employed properly, these unique metallic alloys provide an adherent and intimate bonding contact between the materials to which it is joined—while minimizing the mechanical and chemical stresses and alterations to the joined materials themselves. While a variety of different chemical compositions and formulations are encompassed by the adhesive metallic alloys comprising the present invention, each embodiment demonstrates at least four valuable physical properties which are shared in common. These are: improved wetting properties; a melting point which is less than 100° C. and generally between 60°–70° C.; an unusual degree of chemical stability which avoids oxidation at temperatures less than 100° C. and does not chemically attack other compositions; and an adhesive interface strength at ambient room temperature (20° C.) for synthetic materials which is unique and enduring.

The adhesive metallic alloys comprising the present invention presume both familiarity and substantive knowledge regarding metals and metallurgy, modes of preparation, and conventional practices regarding metallic alloys commonly useful as solders in a variety of different applications. The detailed description which follows hereinafter employs the commonly used terms, definitions, and usages for the physical properties, characteristics, and parameters of metallic alloys traditionally used as electrically conductive materials as well as the methods for analyzing such parameters and characteristics—all of which are well understood and conventionally recognized in the art. For these reasons, specific details regarding the means and manner of making empirical determinations will generally be summarized only. For more detailed knowledge and information, a variety of printed publications are listed below, the individual texts of which are expressly incorporated by reference herein. These include: Howard H. Manko, *Solders And Soldering*, McGraw-Hill Book Company, 2nd edition, 1979; and M.A. Omar, *Elementary Solid State Physics: Principles And Applications*, Addison-Wesley Publishing Company, 1975.

In order to more easily and completely understand the chemical formulations, uses, essential physical parameters and characteristics, and advantages of the adhesive metallic alloys comprising the present invention, the detailed description will be presented as individual sections directed to specific attributes followed by the presentation of experiments and empirical data which factually evidence and support the detailed disclosure.

I. Chemical Composition And Formulations

The adhesive metallic alloys comprising the present invention are mixtures of indium which can be formulated as binary, tertiary, quaternary, and even greater numerical systems of metals alloyed together. For this reason, while the proportional amounts (generally determined as atomic percent) may vary greatly, it is most useful to characterize the individual formulations of alloys as being composed of a primary metal, indium, which has been alloyed with an additive composition comprising at least one other metallic substance. On this basis, at least three different groupings or subclasses of binary metallic alloys have been found useful. These are: alloys where the additive metal is mercury; alloys where the additive metal is gallium; and alloys where the additive metal is bismuth. Each binary alloy will be described individually.

Alloys Comprising Indium and Mercury

All of the preferred embodiments of this individual subclass employ mercury and indium in the chemical formulation. In the most preferred embodiments of this group, mercury is alloyed with indium alone, the ratio (in atomic percent) of mercury:indium being preferably either 13:87 or 33:67 respectively. These preferred binary mercury:indium alloys provide a eutectic mixture with a melting temperature of −31.5° C. or a solid mixture with a melting point of about 60° C. This is in contrast to the melting point of indium alone which is 156.6° C.—a temperature at which indium becomes a moderate reducing agent able to attack other metals. In general, when mercury is employed as an additive metal, it is most desirably employed alone with indium to form an amalgam. In this manner, mercury can be employed in this binary alloy system in an operative range ranging from about 10 to 40 atomic percent while indium is used as the primary metal in quantities ranging from about 90 to 60 atomic percent.

As an alternative, tertiary, quaternary, and other alloy systems can also be prepared utilizing both indium and mercury. In these instances, the other additive substances may include one or more of the following: gallium, bismuth, cadmium, tin, lead, and even very small amounts of copper and silver. The operative and preferred ranges in atomic percent of each additive metal are provided by Table I below.

TABLE I

| NAME | | OPERATIVE RANGE (atomic percent) | PREFERRED RANGE (atomic percent) |
|---|---|---|---|
| Primary Metal: | Indium | 10-90 | 13-17, 60-67, and 85-89 |
| Additive Composition: | Mercury | 10-40 | 11-15 or 33-40 |
| | Gallium | 0-40 | 0-10 |
| | Bismuth | 0-55 | 15-40 |
| | Cadmium | 0-30 | 0-5 |
| | Tin | 0-15 | 0 |
| | Lead | 0-10 | 0 |
| | Copper | 0-5 | 0-1 |
| | Silver | 0-5 | 0-3 |

It will be appreciated that regardless of which metals are employed to formulate the additive composition to be alloyed with indium, an alloy is obtained which has a minimum melting point which in each instance is less than 100° C. Clearly, the precise melting point will vary with the choice of metals employed as the additive composition and their individual atomic percentages. It will be appreciated also that the recognized melting point for each of the metals comprising the additive composition has an individual melting point, each of which varies markedly from the other. This is demonstrated by Table II below. Nevertheless, the resulting alloy when prepared as described will in each instance demonstrate a melting point less than 100° C. and preferably provide a melting point in the range from about 50°-60° C.

It will be noted and appreciated that this maximum melting temperature requirement is critical and essential for the alloys to be suitable with non-conductive materials. This is because the higher the melting temperature for the alloy, the higher the likelihood of surface oxidation, reduction, and contamination of the resulting junction. The avoidance of such surface oxidation, reduction, and contamination is one major difference and advantage provided by the unique adhesive metal alloys of the present invention.

TABLE II

| METAL | MELTING POINT (°C.)* |
|---|---|
| Indium | 156.61 |
| Mercury | 38.87 |
| Gallium | 29.78 |
| Bismuth | 271.3 |
| Cadmium | 320.9 |
| Tin | 231.89 |

TABLE II-continued

| METAL | MELTING POINT (°C.)* |
|---|---|
| Lead | 327.5 |
| Copper | 1,083.0 |
| Silver | 960.8 |

*Handbook of Chemistry and Physics, The Chemical Rubber Company, 1970.

Alloys Comprising Indium and Gallium

The second grouping of metallic alloys comprising the present invention preferably employs gallium alone as the additive metal. In this instance, the preferred formulations employ a binary system of gallium and indium in a preferred atomic percent ratio of 10:90. This preferred binary alloy has a melting point of approximately 30° C.

As an alternative, gallium may be alloyed with indium and one or more other metals, and with or without mercury. The operative and preferred ranges of the other metals believed useful in the additive composition are provided by Table III below.

TABLE III

| NAME | | OPERATIVE RANGE (atomic percent) | PREFERRED RANGE (atomic percent) |
|---|---|---|---|
| Primary Metal: | Indium | 0-90 | 70-90 |
| Additive | Gallium | 10-40 | 10-25 |
| Composition: | Bismuth | 0-55 | 0-30 |
| | Cadmium | 0-30 | 0 |
| | Tin | 0-15 | 0 |
| | Lead | 0-10 | 0 |
| | Copper | 0-2 | 0-1 |
| | Silver | 0-5 | 0-3 |

Alloys Comprising Indium and Bismuth

The third group of metallic alloys demonstrating the desired properties uses indium and bismuth alone as the binary alloy. There are a broad variety of different formulations and compositions comprising bismuth and indium alone or in combination with other metal alloy solders. It will be recognized and appreciated from the data provided by Table IV that each of the metals listed as a possible component of the additive composition has also been previously identified as useful in preparing alloys based on mercury and gallium as seen by Tables I and III respectively. The major differences, however, lie in the atomic percent of each individual metal in the operative and preferred ranges when bismuth is present in relatively high quantity.

TABLE IV

| NAME | | OPERATIVE RANGE (atomic percent) | PREFERRED RANGE (atomic percent) |
|---|---|---|---|
| Primary Metal: | Indium | 10-90 | 75-90 |
| Additive | Bismuth | 10-55 | 10-25 |
| Composition: | Gallium | 0-40 | 10-20 |
| | Cadmium | 0-30 | 0-10 |
| | Tin | 0-15 | 0 |
| | Lead | 0-10 | 0 |
| | Copper | 0-2 | 0-1 |
| | Silver | 0-5 | 0-3 |

A quick review of the data presented by Tables I to IV inclusive will reveal that the designations "additive" and "additive composition" are relative terms of convenience alone. Clearly, gallium which is listed as an optional component of the additive compositions within Tables I and IV is also the preferred additive metal of Table III. Similarly, the preferred additive metal of Table IV, bismuth, is listed merely as one metallic component optionally used to formulate the tertiary or quaternary alloys within the formulations of Tables I and III respectively. It is therefore apparent that the groupings of additives based dominantly on mercury, gallium, or bismuth as previously described have been presented merely as an aide to understanding the range and variety of metallic components and formulations themselves; and do not represent major differences of kind among the individual alloy systems themselves. The representations of mercury, gallium, and bismuth as major additive substances are, thus, for convenience alone, and intended to identify at least one metal in the alloy formulation which is always present in measurable quantity in combination with indium—whereas the other metals may be optionally present or absent as required or desired by the individual user.

II. Essential Characteristics And Properties Of The Adhesive Alloys Shared In Common There are not less than four characteristics and physical properties shared in demonstrable degree by operative embodiments of the present invention. These physical parameters and features represent the capabilities and advantages common to all these adhesive alloys; and serve as a factual basis by which any member of this class of adhesive alloys can be identified and differentiated from other previously known and conventionally used formulations. These are: unique wetting properties; a melting point temperature less than 100° C. in al instances; chemically stable formulations which do not oxidize when melted and do not act as reducing agents to attack detrimentally other materials; and an easy and fast adhesion process resulting in an enduring bond strength with synthetic materials unlike some provided by conventionally known methods.

Enhanced Wetting Properties

The role of wetting and the property of physical wetting by which a molten alloy spreads over and adheres to a surface is conventionally understood and well described in the literature [see, for example, Howard H. Manko, *Solders And Soldering*, 1975, pages 4-21, and the references cited therein]. It is the physical wetting of the material to be joined by the molten alloy that generates the spreading, adherent surface interface; and the solidification of the molten alloy after wetting which results in a permanent bond and durable juncture. A commonly accepted measurement of the wetting characteristics of any alloy is to measure the spreading surface angle, commonly called the dihedral angle (o), formed between the molten alloy and the surface of the solid material to be joined. As recognized, the dihedral angle (o) is a measure of the surface tension, gravity, and interfacial tensions between the molten alloy and its surroundings as positioned on the surface of the material to be joined. Totally nonwetting compositions demonstrate an angle (o) of about 100 degrees; totally wetting alloys reveal an angle (o) of about 0 degrees; and substances having an angle (o) between 90 and 0 degrees are deemed partially wetting compositions. In sum, the less the dihedral angle (o), the greater the wetting properties of the composition.

All of the metallic alloys comprising the present invention provide greatly improved wetting properties with a demonstrable dihedral angle ranging generally from about 65 to 105 degrees. The preferred mercury:indium alloys show extremely good wetting characteristics with a dihedral angle smaller than 75 degrees, and often less than 65 degrees. It will be recognized that the degree of wetting and the measurement of the dihedral angle varies dramatically with the purity and cleanliness of the surfaces of the material to be joined and the formulation of the metallic alloy itself. It is most desirable that the materials about to be joined be free of oils, moisture, foreign oxidized particles, and the like—each of which markedly contributes to reducing the degree of wetting. The best results are achieved with freshly cleaned and polished surfaces on the materials about to be joined. Merely illustrative of the adhesive metallic alloys which provide enhanced wetting properties are those listed within Table V below.

TABLE V

| ALLOY | RATIO (atomic percent) | DIHEDRAL ANGLE (estimated) |
|---|---|---|
| Hg:In | 13:87 | o ≦ 75° |
| Hg:In | 37:63 | o ≦ 75° |
| In:Ga | 92:8 | o ≦ 75° |
| Bi:In | 22:78 | o ≦ 75° |
| Hg:In:Ga | 5:85:10 | o ≦ 75° |
| Bi:In | 35:65 | o ≦ 75° |
| Sn:In:Hg | 5:80:15 | o ≦ 75° |
| In:Ga | 24:76 | o ≦ 75° |
| Cd:Ga:In | 5:15:80 | o ≦ 75° |
| Pb:In:Hg | 5:80:15 | o ≦ 75° |
| Cd:In:Hg | 4:80:16 | o ≦ 75° |
| Hg:Ga:Cd:In | 10:5:10:75 | o ≦ 75° |

Melting Point Temperatures Less Than 100° C.

Some of the preferred adhesive metallic alloys and bonding amalgams formulated in accordance with the present invention are eutectic mixtures; and some are solid state metallic mixtures. The melting point for all those adhesive and bonding alloys is in each instance less than 100° C. The preferred embodiments composed of mercury and indium alone, particularly those formulations containing more than 65 atomic percent indium, provide an amalgam which melts at a temperature about 60° C. The other alloys formulated, with or without mercury, generally have a melting point ranging from about −40° to 95° C. None of these adhesive metallic alloys will demonstrate a melting point above 100° C.

There are both physical and chemical benefits provided by this reduced melting point property common to all the properly prepared metallic alloys. First, these adhesive alloys minimize mechanical and chemical stresses as well as potential alterations to the chemical composition of all materials which are joined or bonded by them. Clearly, exposure to temperatures less than 100° C offers a reduced exposure to heat and less opportunity for effected unwanted changes. Equally important, it is recognized that many substances which would normally burn or become melted, deformed, or otherwise damaged at high temperatures can be joined. By providing melting points for the adhesive alloys and a bonding temperature which is not greater than 100° C., the bonding process is sufficiently low temperature as to avoid burning or substantially deforming the surfaces of these temperature sensitive materials; this bonding temperature is also low enough as to avoid most other alterations to both non-conductive materials and electrically conductive compounds generally.

Enhanced Chemical Stability

Another major property and characteristic of the present adhesive metallic alloys and bonding amalgams is their ability to avoid being oxidized substantially even when liquified. This is due to their unique property of melting at temperatures less than 100° C.; and is also due to the chemical stability of the formulations themselves which resist oxidation during the heating process into semi-liquid or completely liquified states. Equally important, the chemical compositions of the metallic alloys themselves, regardless of atomic percentage, are chemically stable and do not in any meaningful degree attack or react with the materials to be joined. Accordingly, an enduring physical contact and bonding juncture is provided by these adhesive alloys between nonconductive materials and other substances which are mechanically strong and chemically resistant over an indefinite time period.

Enduring and Unusual Bonding Properties and Bond Strength

Since the application of the alloys requires them to be heated to their melting point, and their melting point is between 60°-70° C. (well below the boiling point of water), many substances which would ordinarily burn at the melting temperature of an ordinary solder can be wetted and bonded by the above mentioned alloys. These include:

1. Paper: The alloys adhere to paper when the alloys are spread on paper which is heated to 70° C. This is useful for the making of electrically conducting paper or other conducting sheets which are used for shielding or conductive purposes. Since the adhesive alloys have a relatively small resistivity compared to the best conductors, such a sheet could also optionally be used as a "low temperature" (up to 50° C.) heater when a current is passed through it.

2. Wood: Wood heated to 70° C. will adhere to a variety of the alloys. If an electrically conducting wooden surface is desirable (such as in instances where static electricity is to be eliminated), the surface of the wood should be coated with one of the prepared alloy formulations. Conversely, an antenna could be "painted" on a nonconductive surface attached to the wood, with that nonconductive surface being the substrate for the antenna.

3. Teflon and Nylon: Teflon and other fluorochlorocarbon compositions are very hard to bind. Nylons of various formulations are only slightly less difficult to attach. The alloys of the present invention adhere to both these kinds of materials as well as other synthetic substances which are typically very difficult to join. Accordingly, the alloys may be used as adhesives to join two Teflon elements permanently. Moreover, since Teflon is used conventionally in vacuum gaskets and the alloys are themselves pliable, these alloys may be used as repair materials and components for such gaskets. As an added benefit, the alloys can also be used as circuit elements on a Teflon substrate if applied in specific patterns.

Note also that the adhesion of these alloys to Teflon provides unique strength properties. For instance, if an alloy of the present formulation is melted in a Teflon coated aluminum pan or a Teflon coated stainless steel skillet and allowed to cool and solidify, the Teflon coating will be found to adhere more tightly to the hardened alloy than to the aluminum or stainless steel surface upon which the Teflon was originally applied. Thus, if one attempts to peel off the hardened alloy from the Teflon surface of the pan, one will peel the Teflon off the aluminum or stainless steel metal before the Teflon will release its adherent juncture with the hardened alloy.

4. Ceramics: The alloys adhere without difficulty to glazed and unglazed ceramic cups and dishes. The alloys also adhere tightly to clay and brick surfaces. In the latter instance, the clay will fracture to maintain its adherence to the alloy rather than permit a rupture of the adherent juncture formed between the alloy and the clay surface. Thus the bond strength between clay and these alloys is demonstrably greater than that between clay and clay.

5. Glass: The alloys adhere to glass when heated to 70° C. Thus, the adhesive alloys could be used for the "silvering" of mirrors, Dewar Vessels for cryogenic purposes or ordinary "thermos" applications. The bonding alloys also become superconducting at temperatures close to those of liquified helium, $-269°$ C. Therefore, below the superconducting transition temperature of the bonding alloy, one could make an ideal electromagnetic shielded chamber.

6. Graphite: The alloys adhere to graphite and thus make ideal electrical contact media between graphite and other conductors.

7. Semiconductors: The alloys adhere to semiconductors such as silicon and germanium, again making them useful as electrical contact media for those substances.

III. Preparation Of The Adhesive Metallic Alloys

The preparation of adhesive metallic alloys comprising the present invention follows conventional practice regarding the blending of metals. As recognized, each metal has its individual and distinctive melting point as indicated by Table II previously. Once the desired formulation and chemical composition of the alloy to be prepared has been decided, the proper atomic percentage amount of each metal is to be placed into a crucible which is then heated to a temperature in the rang of the melting point of the metal with the highest melting temperature. Each metal is added to the crucible in turn and the resulting liquid is preferably stirred mechanically to help the alloying process. When the liquified alloy has been formed, the liquid alloy mixture is allowed to stand motionless in order to allow such oxides or other impurities as might have been formed to float to the top and to be skimmed off. It is most desirable that the temperature of the crucible be tightly controlled to reduce the risk of oxides being created. Moreover, when any of the metals used in the formulation is recognized as being substantially reactive with molecular oxygen, it is required that the alloying method be performed within a closed, non-oxidizing atmosphere (such as a nitrogen environment) to avoid adulterations to the mixing and alloying process.

Once prepared as a molten alloy, the liquid mixture can then be prepared in any desired shape, size or format using the normal procedures and apparatus of casting, molding, etc. It is most desirable, however, that sensible precautions be used to avoid accidentally oxidizing, contaminating, or tampering with the alloy during this shaping process.

IV. Method Of Using The Adhesive Metallic Alloys

The uses of the unique bonding metallic alloys are for making an enduring adhesive contact between non-conductive materials themselves, between electrically conductive materials, and between a non-conductive material and a conductor. An illustrative example would be the attachment of the bonding alloys to normally conductive metallic electrodes or to glass, Teflon, or paper. For illustrative purposes only, therefore, the description of the method of use will be limited in detailed description to this specific context; nevertheless, it will be understood and accepted that this description is merely representative of the general methodology which is deemed applicable to any combination of materials of any kind or composition.

To ensure wettability and a minimum of electrical resistance as a result of using these unique adhesive metallic alloys, it is imperative that the surfaces of the materials to be joined be free of oil, moisture, alloy oxides, and any other impurity. The preferred relative humidity surrounding the bond while soldering is preferably from 0 to 75 percent, the wettability of the bonding alloy being enhanced in ever drier environments.

In general, a soldering iron commonly used in printed circuit soldering, is suitable for melting the bonding alloy when present in a solid physical state and for physically spreading the heated alloy onto the material about to be joined. The recommended temperature of the soldering iron (or other similar heating apparatus) is approximately 60° C., a temperature which can be effectively controlled by connecting the soldering iron to a "Variac" autotransformer. It will be understood, however, that the exact heating temperature presented by the soldering iron (or other heating apparatus) will conform to that minimal temperature necessary to render the solid bonding alloy into a semi-liquid, mushy state or into a completely liquified form. Under no circumstances whatsoever, is this heating temperature to exceed approximately 100° C.

As a first step, the surface of the non-conductive material where the bond is to be made should be freshly prepared, cleansed, and preferably polished by using fine emery cloth. If the surface of the non-conductive material is not sufficiently polished, the physical act of bonding by the alloy can still be made; however, the degree of mechanical strength and the durability of the bonding interface will consequently be altered. It is also most desirable that the surface of the other matter to be joined to the non-conductive material also be dry and free of oils and other impurities such as soldering flux paste, fingerprints, dust, and the like.

The prepared adhesive alloy or bonding amalgam is then heated using the soldering iron at the controlled minimal temperature; and the alloy brought to a semi-liquid (mushy) or completely liquid state. The heated alloy is then rubbed physically onto the freshly prepared surface of the non-conductive material until the surface is completely wetted by the heated alloy. It is desirable that the temperature of the non-conductive material be identical to the temperature of the heated alloy at the moment of physical contact to aid the wetting process. Similarly, the cleansed surface of the other matter to be joined to the non-conductive material should also be wetted with the heated alloy in a similar fashion. This physical introduction of heated adhesive alloy and wetting of the individual surfaces of the materials to be joined is a necessary preliminary step in order to ensure an effective bonding contact which is enduring and resistant to mechanical and chemical stresses. The heated adhesive alloy is applied directly onto one surface preferably using a soldering iron at the desired heating temperature and concurrently applied to the surface of the material as well. Subsequently, the alloy-wetted surfaces of the two substances are joined together with or without additional heated alloy as necessary to form a solid juncture and strong physical union. After the bonding alloy juncture is physically formed, it is allowed to cool and solidify. The solidified bonding alloy juncture then demonstrates a mechanical bond resistant to physical and chemical stresses.

Several precautions regarding the manner of using the adhesive metallic alloys and the mode of its application to the surfaces of the various materials should be noted. Initially, it will be recognized that the adhesive metallic alloys comprising the present invention may be presented initially at room temperature (20° C.) in either solid or liquid physical states. For the solid state formulations of the alloys, the recommended temperature for the soldering iron (or other heating apparatus) is not more than the highest temperature required to begin the melting process, and preferably is only 60° C. At temperatures markedly higher than that necessary to melt the metallic alloy, the wettability of the alloy will decrease and a very real risk of moderate oxidation, reduction, or surface contamination can occur. Similarly, at temperatures lower than the minimal melting point temperature for the bonding alloy, the alloy becomes solid which, in turn, impairs the ability to wet the surfaces of the materials to be joined. Alternatively, for those adhesive alloy formulations which are liquid at room temperature and solidify at temperatures less than 100° C., the operative use temperature limits extend from approximately 20° C. to the actual solidification temperature for the bonding alloy.

As regards the timing for the soldering process, the minimal time limit required to make an effective bond using a semi-liquid or liquefied alloy is approximately 3 seconds per square millimeter of surface area when using a pencil type soldering iron. There is no maximal time limit for the actual soldering, but it is desirable that no more than 10 seconds per square millimeter of contact surface be utilized to avoid creating oxidation conditions or alterations to the materials themselves. When soldering metallic surfaces, it is not recommended to extend the soldering time unnecessarily to avoid the formation of intermetallic compositions which will alter the melting point, wetting properties, or other characteristics of the bonding alloy. Again, in preferred use environments, the relative humidity surrounding the act of bonding the alloy to the conductive materials should be as low as possible, and be less than 75 percent humidity in all instances.

The present invention is not to be restricted in form nor limited in scope except by the claims appended hereto.

What we claim is:

1. A method for bonding conductive materials to themselves or to non-conductive materials, said method comprising the steps of:

obtaining a bonding alloy comprising
from about 10 to 90 atomic percent indium, and an additive comprised of from a measurable amount to about 40 atomic percent mercury, from a measurable amount to about 40 atomic percent gallium, and from 0 to about 55 atomic percent bismuth;
preparing a surface of each material to be bonded as a clean surface;
heating said bonding alloy such that at least a non-oxidized, semi-liquid state is formed;
introducing said heated bonding alloy to each non-oxidized surface such that each of said surfaces becomes substantially wetted by said heated alloy;
applying additional heated bonding alloy as needed to each of said wetted surfaces concurrently to form a continuous alloy juncture between said materials; and
allowing said alloy juncture to cool and solidify such that a bonded interface between said surfaces is provided by said solidified alloy.

2. A method for bonding non-conductive materials to themselves or to conductive materials, said method comprising the steps of:

obtaining a bonding alloy comprising
from about 10 to 90 atomic percent indium, and an additive comprised of from a measurable amount to about 40 atomic percent mercury, from a measurable amount to about 40 atomic percent gallium, and from 0 to about 55 atomic percent bismuth, from 0 to about 30 atomic percent cadmium, from 0 to about 15 atomic percent tin, and from 0 to about 10 atomic percent lead;
preparing a surface of each material to be bonded as a clean surface;
heating said bonding alloys such that at least a non-oxidized, semi-liquid state is formed;
introducing said heated bonding alloy to each non-oxidized surface such that each of said surfaces becomes substantially wetted by said heated alloy;
applying additional heated bonding alloy as needed to each of said wetted surfaces concurrently to form a continuous alloy juncture between said materials; and
allowing said alloy juncture to cool and solidify such that a bonded interface between said surfaces is provided by said solidified alloy.

3. A method for bonding a material to itself or to other materials, said method comprising the steps of:

obtaining a bonding alloy comprised essentially of from about 10 to 90 atomic percent indium, and from a measurable amount to about 40 atomic percent mercury;
preparing a surface of each material to be bonded as a clean surface;
heating said bonding alloys such that at least a non-oxidized, semi-liquid state is formed;

introducing said heated bonding alloy to each non-oxidized surface such that each of said surfaces becomes substantially wetted by said heated alloy;

applying additional heated bonding alloy as needed to each of said wetted surfaces concurrently to form a continuous alloy juncture between said materials; and allowing said alloy juncture to cool and solidify such that a bonded interface between said surfaces is provided by said solidified alloy.

4. A method for bonding a material to itself or to other materials, said method comprising the steps of:

obtaining a bonding alloy comprised essentially of from about 10 to 90 atomic percent indium, and from a measurable amount to about 40 atomic percent mercury;

preparing a surface of each material to be bonded as a clean surface;

heating said bonding alloys such that at least a non-oxidized, semi-liquid state is formed;

introducing said heated bonding alloy to each non-oxidized surface such that each of said surfaces becomes substantially wetted by said heated alloy;

applying additional heated bonding alloy as needed to each of said wetted surfaces concurrently to form a continuous alloy juncture between said materials; and allowing said alloy juncture to cool and solidify such that a bonded interface between said surfaces is provided by said solidified alloy.

* * * * *